(12) United States Patent
Hsieh

(10) Patent No.: US 6,170,563 B1
(45) Date of Patent: Jan. 9, 2001

(54) HEAT RADIATING DEVICE FOR NOTEBOOK COMPUTER

(76) Inventor: Hsin-Mao Hsieh, No. 6, East Section, Chiao Nan Li, Industrial 6th Rd., Pingtung City, Pingtung Hsien (TW)

(*) Notice: Under 35 U.S.C. 154(b), the term of this patent shall be extended for 0 days.

(21) Appl. No.: 09/360,606

(22) Filed: Jul. 26, 1999

(51) Int. Cl.[7] .............................. F28F 13/12; F28F 7/00; H05K 7/20
(52) U.S. Cl. ...................... 165/122; 165/80.3; 361/697
(58) Field of Search .................................. 165/121, 122, 165/123, 125, 80.3; 361/697; 257/722, 703

(56) References Cited

U.S. PATENT DOCUMENTS

| | | | |
|---|---|---|---|
| 5,437,327 | * 8/1995 | Chiou | 165/122 |
| 5,452,181 | * 9/1995 | Hoover | 361/697 |
| 5,629,834 | * 5/1997 | Kodama et al. | 165/122 |
| 5,661,638 | * 8/1997 | Mira | 361/697 |
| 5,787,971 | * 8/1998 | Dobson | 165/80.3 |
| 5,940,268 | * 8/1999 | Miyahara et al. | 165/80.3 |
| 5,940,269 | * 8/1999 | Ko et al. | 165/122 |
| 5,978,219 | * 11/1999 | Lin | 165/80.3 |

* cited by examiner

Primary Examiner—Ira S. Lazarus
Assistant Examiner—Tho Duong
(74) Attorney, Agent, or Firm—Thomas, Kayden, Horstemeyer & Risley LLP

(57) ABSTRACT

A heat radiating device for a notebook includes a metallic heat sink having multiple first fins mounted therein, a support base attached to the metallic heat sink and containing a recess therein, the support base having a first side abutting the first fins and a second side containing a grille-shaped air discharge port, multiple second fins received in the recess and each having a height smaller than the depth of the recess, and a fan including a support plate secured on the support base and containing a hole, a bracket mounted on the support plate and received in the recess, and a fan body rotatably mounted on the support bracket.

8 Claims, 5 Drawing Sheets

HEAT RADIATING DEVICE FOR NOTEBOOK COMPUTER

CROSS-REFERENCES TO RELATED APPLICATIONS

Not Applicable.

BACKGROUND OF THE INVENTION

1. Field of the Invention

The present invention relates to a heat radiating device, and more particularly to a heat radiating device for a notebook computer.

2. Description of the Related Art

A conventional heat radiating device (1) for a notebook computer (20) in accordance with the prior art shown in FIG. 5 comprises a metallic heat sink (11) mounted on the top of the central processing unit (not shown) of the notebook computer (20) and includes multiple fins (111), a support base (12) extending from the metallic heat sink (11), and a fan (13) including a casing (131) secured on the support plate (12), and a fan body (132) rotatably mounted in the casing (131). Some of the fins (111) extend through the support base (12), thereby defining multiple guide grooves (122) each connecting to the exhaust port (21) contained in the notebook computer (20). In operation, the heat emitted from the central processing unit of the notebook computer (20) is conducted to the fins (111) of the heat sink (11), and can then be carried outward through the guide grooves (122) of the support base (12) to the exhaust port (21) of the notebook computer (20) by means of the air moved by the rotation of the fan body (132) of the fan (13).

The air flow produced by the rotation of the fan body (132) will flow in two directions as indicated by the arrows so as to be forced out through the exhaust port (21) and flow into the inside of the notebook computer (20) simultaneously such that the hot air flow easily returns to the inside of the notebook computer (50), thereby decreasing the heat dissipation efficiency of the heat radiating device (1). In addition, the fan (13) is directly mounted on the support base (12), thereby increasing the total height of the heat radiating device (1). The present invention has arisen to mitigate and/or obviate the disadvantage of the conventional heat radiating device.

BRIEF SUMMARY OF THE INVENTION

In accordance with one aspect of the present invention, a heat radiating device for a notebook comprises a metallic heat sink including multiple first fins mounted therein; a support base attached to the metallic heat sink and containing a recess therein, the support base having a first side abutting the first fins and a second side containing a grille-shaped air discharge port; multiple second fins received in the recess and each having a height smaller than that of the recess; and a fan including a support plate secured on the support base and containing a hole, a support bracket mounted on the support plate and received in the recess, and a fan body rotatably mounted on the support bracket.

Further benefits and advantages of the present invention will become apparent after a careful reading of the detailed description with appropriate reference to the accompanying drawings.

DETAILED DESCRIPTION OF THE INVENTION

Figure 1:
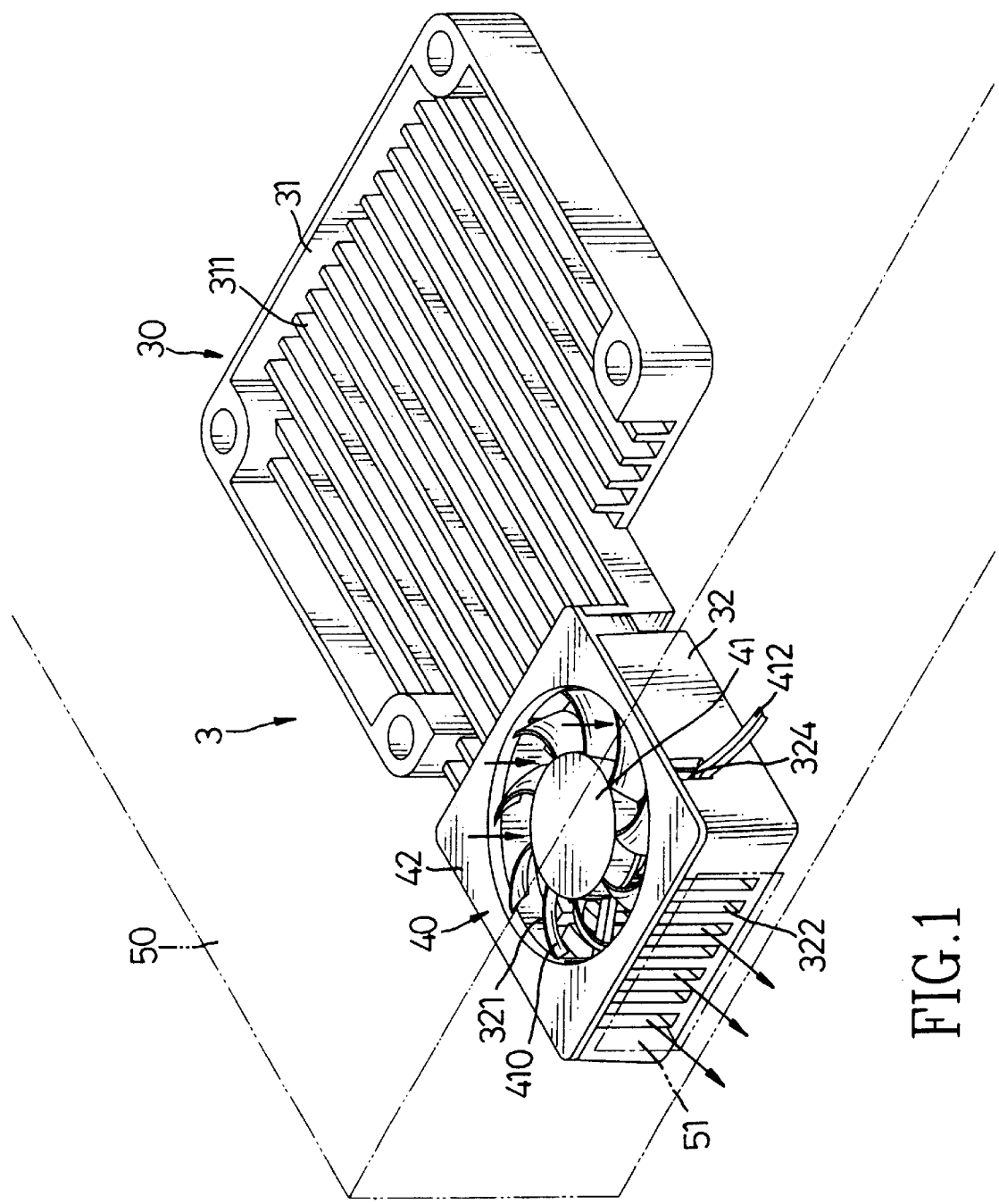
FIG. 1 is a perspective view of a heat radiating device for a notebook computer in accordance with the present invention.
Figure 2:
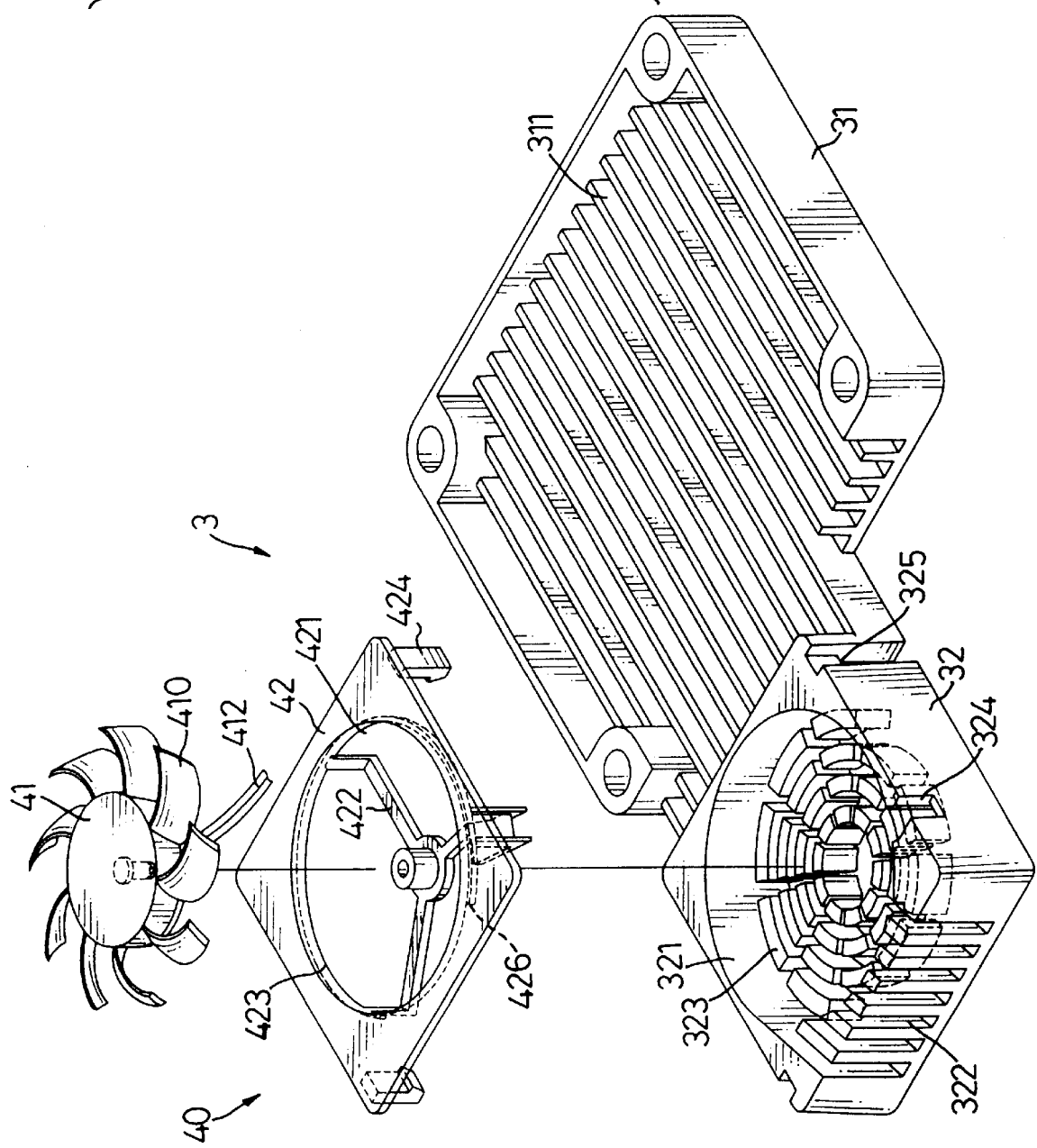
FIG. 2 is an exploded perspective view of the heat radiating device in FIG. 1.
Figure 3:
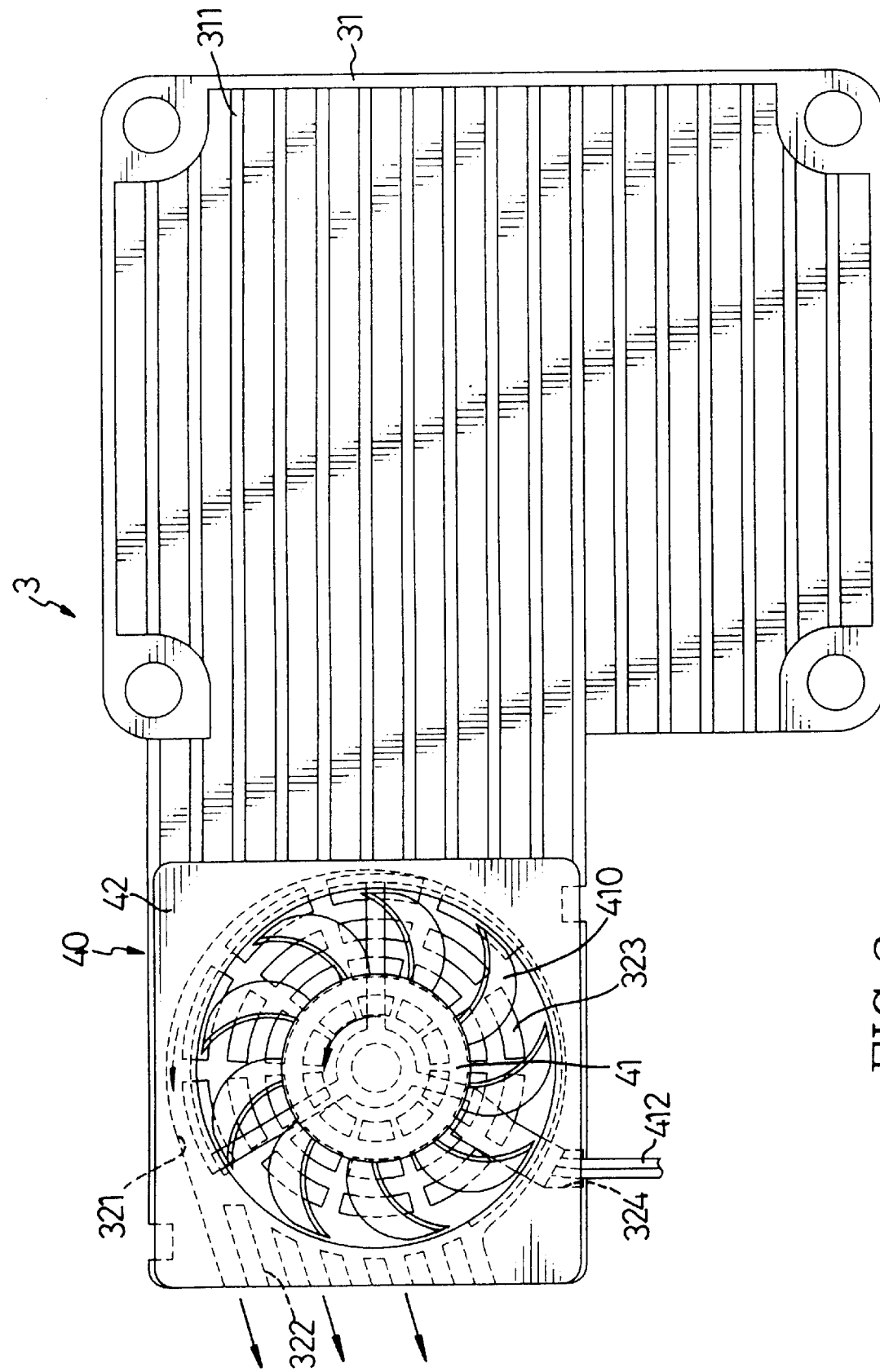
FIG. 3 is a top plan view of the heat radiating device in FIG. 1.

Referring to the drawings and initially to FIGS. 1–3, a heat radiating device (3) for a notebook computer (50) in accordance with the present invention comprises a metallic heat sink (31) including multiple first fins (311), a metallic support base (32) attached to the metallic heat sink (31) and containing a recess (321), multiple second fins (323) in the recess (321) and each having a height smaller than the depth of the recess (321), and a fan (40) including a support plate (42) secured on the support base (32) and containing a hole (421), a bracket (422) mounted on the support plate (42) and received in the recess (321), and a fan body (41) rotatably mounted on the support bracket (422).

The support base (32) contains a wire guide slot (324), and has a first side abutting the first fins (311) and a second side containing a grille-shaped air discharge port (322). The second fins (323) are preferably arranged in a circular manner.

The fan (40) includes a flange (423) extending downward from the hole (421) and containing an opening (426) aligning with the grille-shaped air discharge port (322). The fan body (41) includes multiple curved fan blades (410).

The support base (32) contains multiple locking notches (325) defined in the periphery thereof, and the support plate (42) includes multiple locking hooks (424) extending downward and each secured in one of the corresponding locking notches (325).

In assembly, the heat sink (31) is mounted on the top of the central processing unit (not shown) of the notebook computer (50), with the grille-shaped air discharge port (322) of the support base (32) aligning with the exhaust port (51) contained in the notebook computer (50). The fan body (41) of the fan (40) includes an electrical wire (412) extending through the wire guide slot (324) of the support base (32) and connected to the power supply (not shown) of the notebook computer (50).

In operation, the heat emitted from the central processing unit of the notebook computer (50) is conducted to the first fins (311) of the heat sink (31) and to the second fins (323) of the support base (32), and can then be forced out through the grille-shaped air discharge port (322) of the support base (32) and the exhaust port (51) of the notebook computer (50) by means of the rotation of the fan body (41) of the fan (40). The fan body (41) of the fan (40) is eccentrically mounted in the recess (321) of the support base (32) whereby rotation of the curved fan blades (410) of the fan body (41) will produce an accelerated curling air flow to quickly carry away the heat through the air discharge port (322), thereby increasing the heat radiating efficiency of the heat radiating device (3).

In such a manner, the support base (32) has a single air discharge port (322) such that the heat emitted from the notebook computer (50) is drained outward in one direction only, thereby preventing the hot air flow from returning to the inside of the notebook computer (50). In addition, the fan (40) is fit in the support base (32) in a digging-in manner, thereby slightly reducing the total height of the heat radiating device (3). Further, the grille-shaped air discharge port (322) will prevent foreign objects from entering the inside of the notebook computer (50).

Figure 4:
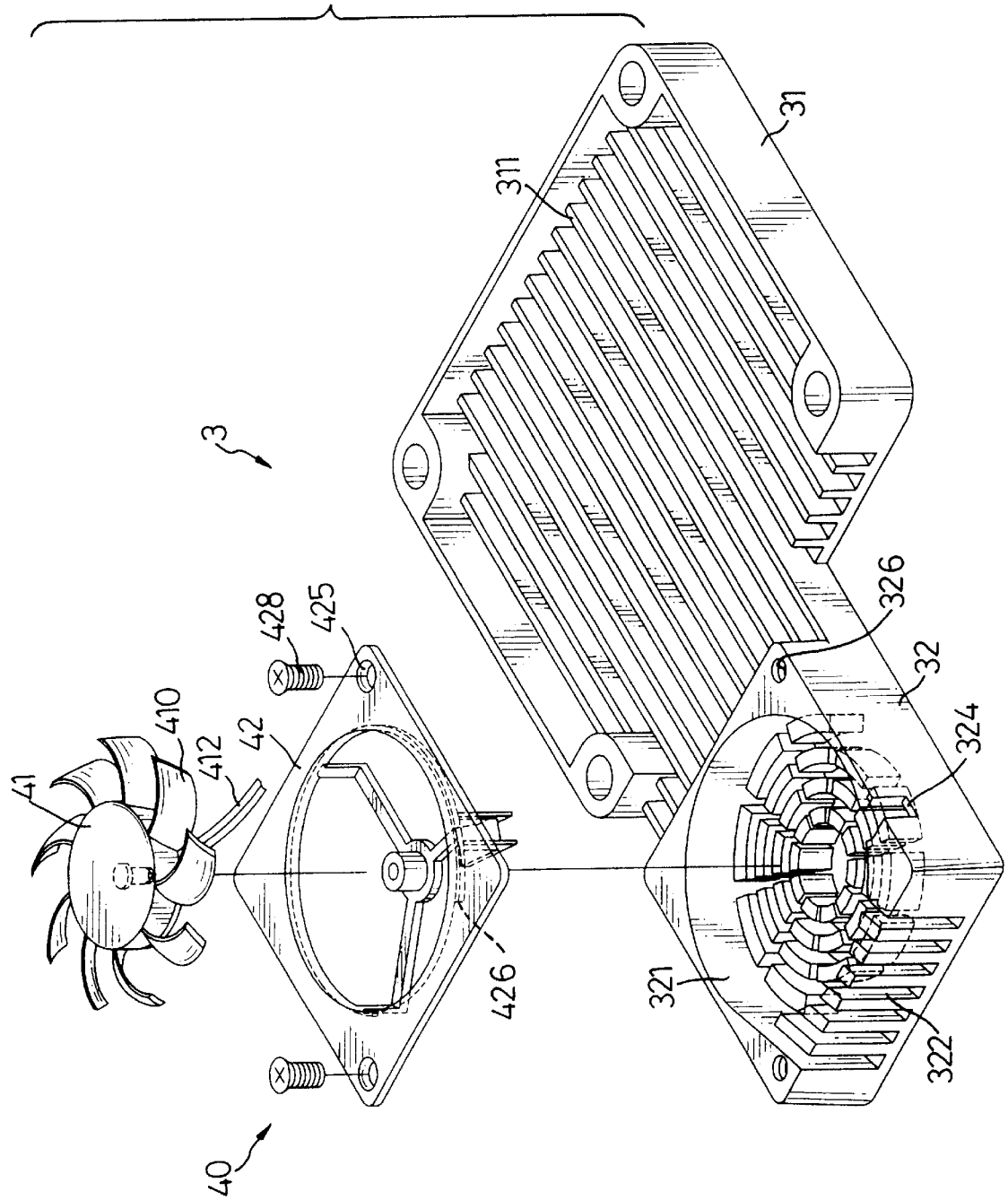
FIG. 4 is an exploded perspective view of a heat radiating device for a notebook computer in accordance with another embodiment of the present invention.
Figure 5:
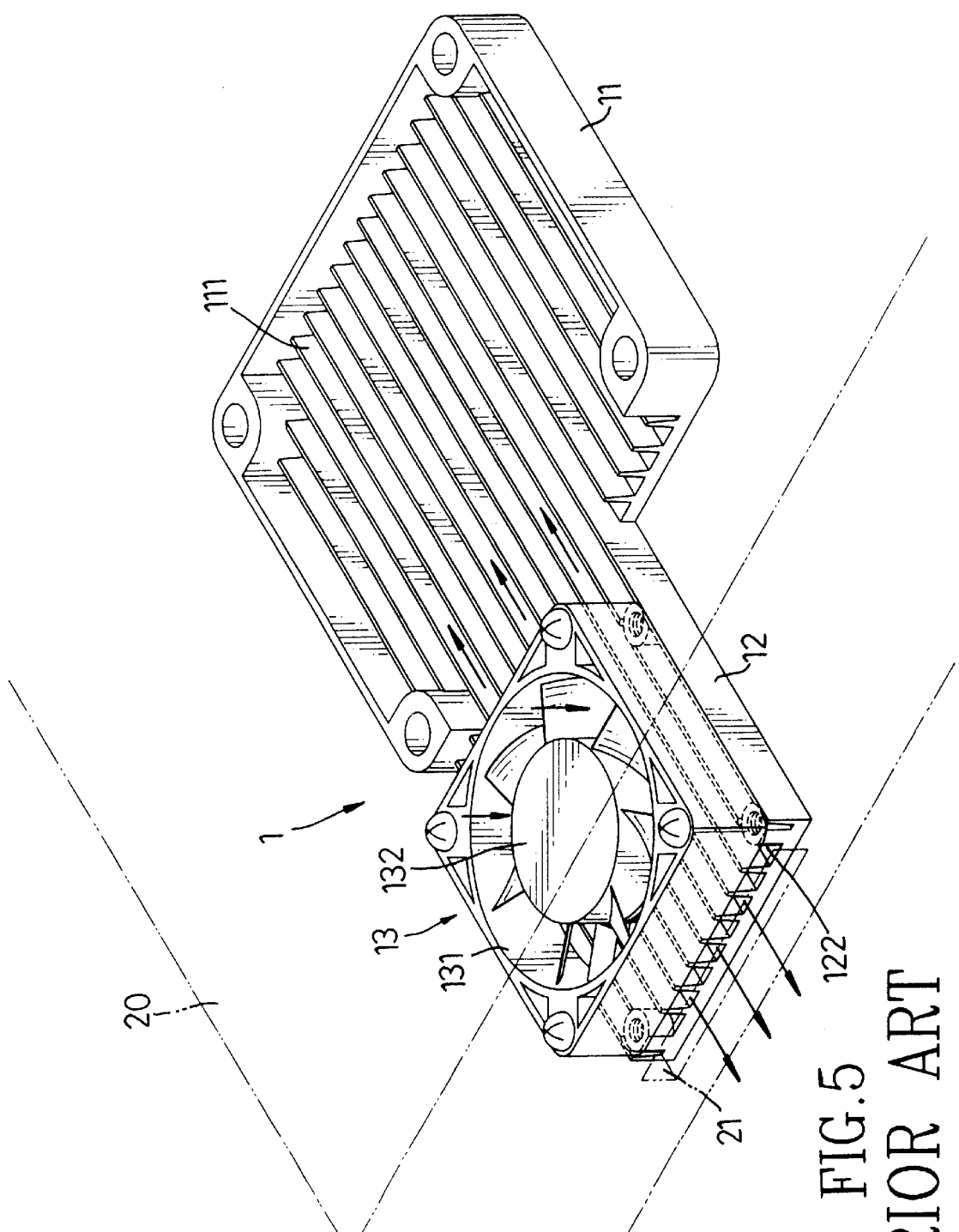
FIG. 5 is a perspective view of a conventional heat radiating device for a notebook computer in accordance with the prior art.

Referring now to FIG. 4, in accordance with another embodiment of the present invention, the support plate (42) contains multiple through holes (425), the support base (32) contains multiple threaded bores (326), and the heat radiating device (3) further comprises multiple screws (428) each extending through one of the corresponding through holes (425) and each screwed into one of the corresponding threaded bores (326).

It should be clear to those skilled in the art that further embodiments may be made without departing from the scope of the present invention.

What is claimed is:

1. A heat radiating device for a notebook comprising:

a metallic heat sink (31) including multiple first fins (311);

a support base (32) attached to said metallic heat sink (31) and containing a recess (321) therein, said support base (32) having a first side abutting said first fins (311) and a second side containing a grille-shaped air discharge port (322);

multiple second fins (323) received in said recess (321) and each having a height smaller than the depth of said recess (321); and a fan (40) including a support plate (42) secured on said support base (32) and containing a hole (421), a bracket (422) mounted on said support plate (42) and received in said recess (321), and a fan body (41) rotatably mounted on said support bracket (422).

2. The heat radiating device in accordance with claim 1, wherein said fan (40) includes a flange (423) extending downward from said hole (421).

3. The heat radiating device in accordance with claim 2, wherein said flange (423) contains an opening (426) aligning with said grille-shaped air discharge port (322).

4. The heat radiating device in accordance with claim 1, wherein said second fins (323) are arranged in a circular manner.

5. The heat radiating device in accordance with claim 1, wherein said fan body (41) is eccentrically received in said recess (321) and includes multiple curved fan blades (410).

6. The heat radiating device in accordance with claim 1, wherein said support base (32) contains a wire guide slot (324) therein.

7. The heat radiating device in accordance with claim 1, wherein said support base (32) contains multiple locking notches (325) defined in the periphery thereof, and said support plate (42) includes multiple locking hooks (424) extending downward and each secured in one of said corresponding locking notches (325).

8. The heat radiating device in accordance with claim 1, wherein said support plate (42) contains multiple through holes (425), said support base (32) contains multiple threaded bores (326), and said heat radiating device further comprises multiple screws (428) each extending through one of said corresponding through holes (425) and each screwed into one of said corresponding threaded bores (326).

* * * * *